(12) United States Patent
Jung et al.

(10) Patent No.: US 7,851,280 B2
(45) Date of Patent: Dec. 14, 2010

(54) ORGANIC ELECTROLUMINESCENT DISPLAY AND METHOD OF FABRICATING THE SAME

(75) Inventors: Ji-sim Jung, Yongin-si (KR); Jany-yeon Kwon, Yongin-si (KR); Jong-man Kim, Yongin-si (KR); Kyung-bae Park, Yongin-si (KR); Takashi Noguchi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/730,344

(22) Filed: Mar. 24, 2010

(65) Prior Publication Data

US 2010/0178724 A1    Jul. 15, 2010

Related U.S. Application Data

(62) Division of application No. 11/624,273, filed on Jan. 18, 2007, now Pat. No. 7,709,842.

(30) Foreign Application Priority Data

Jan. 20, 2006    (KR) .................. 10-2006-0006270

(51) Int. Cl.
*H01L 21/00*    (2006.01)

(52) U.S. Cl. ................ 438/155; 438/164; 257/E21.414
(58) Field of Classification Search .................. 438/73, 438/155, 164; 257/E21.411, E21.413, E21.414
See application file for complete search history.

(56) References Cited

U.S. PATENT DOCUMENTS

5,784,131 A    7/1998    Kim et al.
6,825,496 B2    11/2004    Yamazaki et al.

*Primary Examiner*—Lex Malsawma
(74) *Attorney, Agent, or Firm*—Cantor Colburn LLP (57) ABSTRACT

An organic electroluminescent display ("OELD") includes an organic light-emitting diode ("OLED"), a circuit region, and an interlayer dielectric ("ILD") layer. The OLED is disposed in each of a plurality of pixels arranged on a substrate. The circuit region includes two or more thin film transistors ("TFTs") and a storage capacitor. The ILD layer has two or more insulating layers and includes a first region disposed between both electrodes of the storage capacitor and a second region covering the TFTs. At least one of the insulating layers has a window exposing the insulating layer directly beneath the at least one insulating layer so that that the ILD layer is thinner in the first region than in the second region. Accordingly, it is possible to reduce an occupation area of the storage capacitor while maintaining the necessary capacitance of the storage capacitor and expanding the area of the luminescent region.

10 Claims, 11 Drawing Sheets

ORGANIC ELECTROLUMINESCENT DISPLAY AND METHOD OF FABRICATING THE SAME

CROSS REFERENCE TO RELATED APPLICATIONS

This application is a divisional application of U.S. application Ser. No. 11/624,273, filed on Jan. 18, 2007, which claims priority to Korean Patent Application No. 10-2006-0006270, filed on Jan. 20, 2006, and all the benefits accruing therefrom under 35 U.S.C. § 119, the contents of which in its entirety are herein incorporated by reference.

BACKGROUND OF THE INVENTION

1. Field of the Invention

The present invention relates to an organic electroluminescent display ("OELD"), and more particularly, to a thin film transistor ("TFT") OELD and a method of fabricating the same.

2. Description of the Related Art

Organic electroluminescent displays ("OELDs") are self-luminescent color image displays that use an organic light-emitting diode ("OLED"). Each pixel of an OELD includes a switching (sampling) transistor for sampling an analog image signal, a storage capacitor storing an image signal, and a driving transistor controlling a current supplied to an OLED according to a voltage of the image signal stored in the storage capacitor.

Each pixel of such an OELD is divided into a region in which the switching transistor and the driving transistor are disposed, a region in which the storage capacitor is disposed, and a region in which the OLED is formed.

One problem of such an OELD is that the area of an OLED in one unit pixel must be increased to enhance the luminescent brightness.

In the case of a 2-inch quarter video graphic adapter ("QVGA") OELD with a resolution of 320×240 pixels, the area of one sub-pixel is about 51×240 µm². In order to increase the area of an OLED to enhance the luminescent brightness, regions other than the region in which the OLED is formed must be reduced in area. It is possible to increase the capacitance of the storage capacitor by reducing an inter-electrode gap of the storage capacitor or by using a material with a high dielectric constant. Therefore, it is possible to reduce the occupation area of the storage capacitor by changing a physical structure of the storage capacitor.

However, since the storage capacitor of the OELD is fabricated simultaneously with the switching transistor and the driving transistor, the structures and materials of the switching transistor and the driving transistor are limited. The storage capacitor has the same dielectric layer as an interlayer dielectric ("ILD") layer formed on a gate of a thin film transistor ("TFT") by top gate structure. A conventional OELD includes a single ILD layer. Since the single ILD layer serves to electrically separate a gate and a metal layer below and above the ILD layer respectively, it must not be excessively thin. In general, a storage capacitor of a QVGA OELD must have a capacitance of about 1 pF. Therefore, the thickness of the single ILD layer must not be excessively thin, in order to maintain the capacitance of the storage capacitor at about 1 pF.

BRIEF SUMMARY OF THE INVENTION

The present invention provides an organic electroluminescent display ("OELD") and a fabrication method thereof, which can effectively reduce the occupation area of a storage capacitor in a pixel region with a predetermined area.

The present invention also provides an OELD with an increased luminescent area and a fabrication method thereof.

According to exemplary embodiments of the present invention, there is provided an OELD including an organic light emitting diode ("OLED") disposed in each of a plurality of pixels arranged on a substrate, a circuit region including two or more thin film transistors ("TFTs") and a storage capacitor, and an ILD layer having two or more insulating layers and including a first region disposed between the both electrodes of the storage capacitor and a second region covering the TFTs, wherein at least one of the insulating layers has a window in the first region exposing the insulating layer directly beneath the at least one of the insulating layers so that that the ILD layer is thinner in the first region than in the second region.

According to other exemplary embodiments of the present invention, there is provided an exemplary method of fabricating an exemplary OELD including an OLED, two or more TFTs, and a storage capacitor that are disposed in each of a plurality of pixels, the method including forming an active layer of a switching TFT and an active layer of a driving TFT on a substrate, forming an insulating layer on the substrate and on the active layer of the switching TFT and the active layer of the driving TFT, forming a metal layer on the insulating layer and patterning the metal layer to form a lower electrode of the storage capacitor, a gate corresponding to the active layer of the switching TFT, and a gate corresponding to the active layer of the driving TFT, doping both end portions of each of the active layer of the switching TFT and the active layer of the driving TFT, which are not overlapped by the gates, to form a source and a drain in both of the end portions, forming an ILD layer on the gate of each of the switching TFT and the driving TFT and the lower electrode of the storage capacitor, the ILD layer including two or more insulating layers, etching at least an uppermost insulating layer of the ILD layer, but not a lowermost insulating layer, to form contact holes in at least the uppermost insulating layer on the source and drain of the TFTs, and a contact hole on the lower electrode, forming a protective layer on the lowermost insulating layer over the storage capacitor and in the contact hole on the lower electrode and then forming contact holes in portions of the lowermost insulating layer exposing the source and drain of the thin film transistors, and forming a metal layer on the gate and the ILD layer and patterning the metal layer to form electrodes, which are connected to the source and the drain of the active layer of the switching TFT and the source and drain of the active layer of the driving TFT, and an upper electrode corresponding to the lower electrode of the storage capacitor.

According to other exemplary embodiments of the present invention, there is provided a display including a substrate, portions of a TFT formed on the substrate, a first electrode of a storage capacitor formed on the substrate, an interlayer dielectric layer formed on the portions of the TFT and on the first electrode of the storage capacitor, a first region of the interlayer dielectric layer on the portions of the TFT having a first thickness and a second region of the interlayer dielectric layer on the first electrode having a second thickness, the second thickness less than the first thickness, and a second electrode of the storage capacitor formed on the second region of the interlayer dielectric layer and overlapping the first electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals refer to like elements.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

An organic electroluminescent display ("OELD") according to exemplary embodiments of the present invention will now be described with reference to the accompanying figures.

Figure 1:
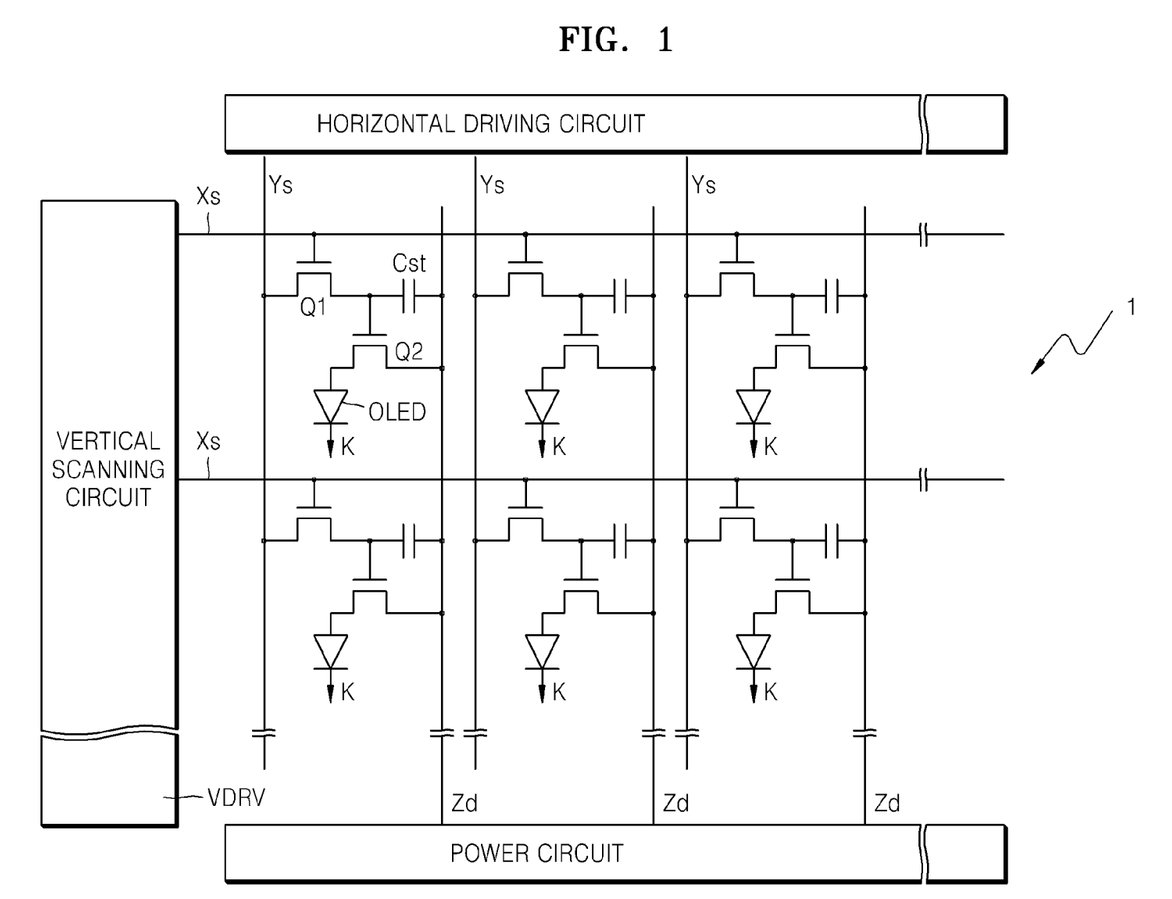
FIG. 1 is an equivalent circuit diagram of an exemplary organic electroluminescent display ("OELD") according to an exemplary embodiment of the present invention.

FIG. 1 is an equivalent circuit diagram of an exemplary "OELD" 1 according to an exemplary embodiment of the present invention.

Referring to FIG. 1, the OELD 1 according to the illustrated embodiment of the present invention uses, for example, a glass or plastic substrate. The OELD 1 includes a plurality of parallel X lines Xs, a plurality of parallel Y lines Ys perpendicular to the X lines Xs, and a plurality of parallel Z lines Zd spaced apart from the Y lines Ys by a predetermined distance. The X lines Xs and the Y lines Ys form a matrix configuration. Pixels are disposed in regions that are defined by the X lines Xs, the Y lines Ys, and the Z lines Zd.

The X lines Xs are scan lines, also referred to as gate lines, to which a vertical scanning signal is applied, and the Y lines Ys are data lines to which a horizontal driving signal (i.e., an image signal) is applied. The X lines Xs are connected to a vertical scanning circuit, and the Y lines Ys are connected to a horizontal driving circuit. The Z lines Zd are connected to a power circuit for driving an organic light-emitting diode ("OLED") of each of the pixels.

Each of the pixels includes a switching thin film transistor ("TFT") Q1, a driving TFT Q2, and a storage capacitor $C_{st}$. In each pixel, the gate, source, and drain of the switching TFT Q1 are connected to one of the X lines Xs, one of the Y lines Ys, and the gate of the driving TFT Q2, respectively. The drain of the switching TFT Q1 is also connected to the storage capacitor $C_{st}$. The switching TFT Q1 operates to apply an electric charge to the storage capacitor $C_{st}$, and the storage capacitor $C_{st}$ accumulates the applied electric charge to store data for each pixel. The storage capacitor $C_{st}$ is connected in parallel to the gate and source of the driving TFT Q2. The source of the driving TFT Q2 is also connected to one of the Z lines Zd. The drain of the driving TFT Q2 is connected to an anode of the OLED. A cathode K of the OLED corresponds to a common electrode shared by all of the pixels.

Figure 2:
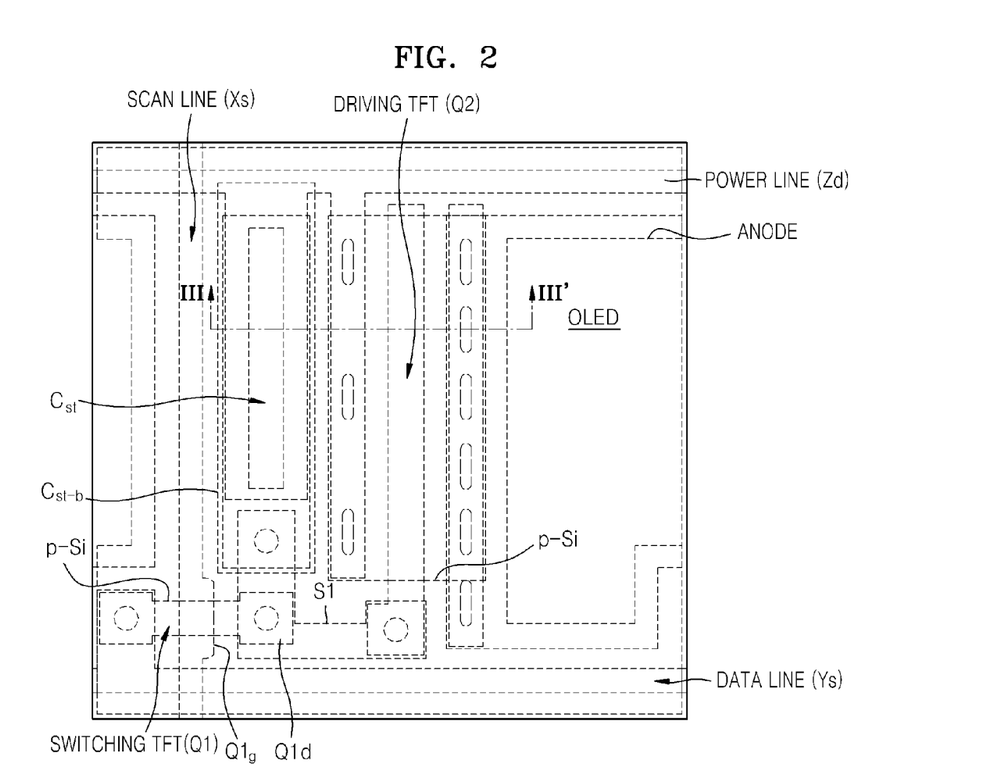
FIG. 2 is a layout diagram of one exemplary pixel of the exemplary OELD illustrated in FIG. 1, according to an exemplary embodiment of the present invention.
Figure 3:
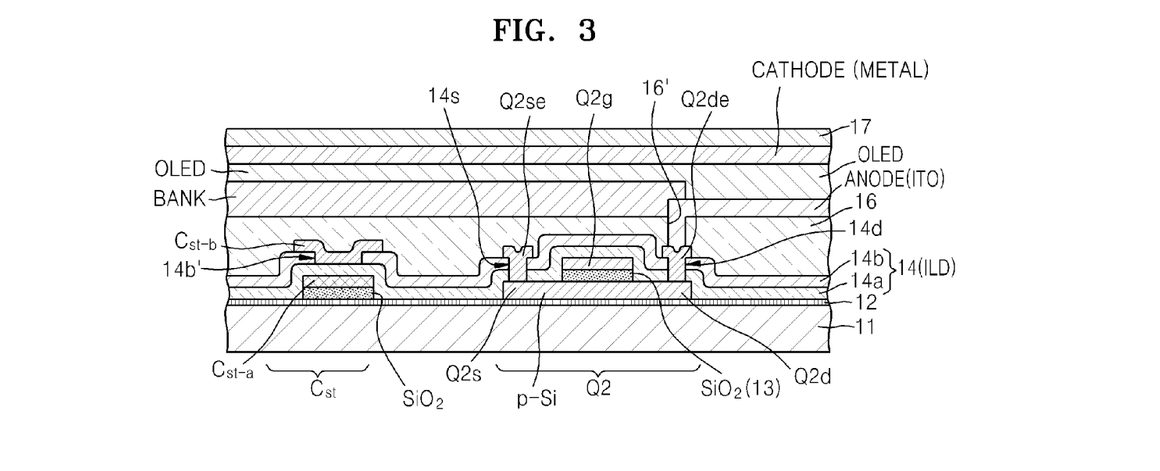
FIG. 3 is a cross-sectional view taken along line III-III' of FIG. 2, according to an exemplary embodiment of the present invention.

FIG. 2 is a layout diagram of one exemplary pixel of the exemplary OELD 1 illustrated in FIG. 1, according to an exemplary embodiment of the present invention and FIG. 3 is a cross-sectional view taken along line III-III' of FIG. 2, according to an exemplary embodiment of the present invention.

Referring to FIG. 2, a Y line Ys (i.e., a data line) and a Z line Zd (i.e., a power (Vdd) line) are disposed in parallel to each other at opposite sides of the pixel, such as at the bottom and top of the pixel, respectively. It should be understood that the bottom and top locations of the Y line Ys and Z line Zd are provided for descriptive purposes only, as they may also be viewed as disposed at left and right sides of the pixel, depending on the orientation of the OELD 1 with respect to a user. Also, the positions of the Y line Ys and Z line Zd may be reversed such that, for example, the Y line Ys is at a top location and the Z line Zd is at a bottom location. In any case, an X line Xs (i.e., a scan or gate line) is disposed perpendicular to the Y line Ys and the Z line Zd. A switching TFT Q1 is disposed at an intersection of the X line Xs and the Y line Ys, and a driving TFT Q2 is disposed near an intersection of the X lines Xs and the Z line Zd. A storage capacitor $C_{st}$ is disposed between the switching TFT Q1 and the driving TFT Q2. An upper electrode $C_{st-b}$ of the storage capacitor $C_{st}$ extends from the Z line Zd, and a lower electrode $C_{st-a}$, as shown in FIG. 3, of the storage capacitor $C_{st}$ is connected through a line layer S1 to a drain Q1$d$ of the switching TFT Q1 and a gate Q2$g$, shown in FIG. 3, of the driving TFT Q2. A gate Q1$g$ of the switching TFT Q1 extends from the X line Xs.

Referring to FIG. 3, a buffer layer 12 is formed on a substrate 11, and the storage capacitor $C_{st}$ and the driving TFT Q2 are formed on the buffer layer 12. The buffer layer 12 is formed of an insulating material, such as SiO$_2$ and SiON. The driving TFT Q2 includes a polysilicon layer p-Si formed on the buffer layer 12, a gate insulating layer 13 formed on the polysilicon layer p-Si, and a gate Q2$g$ formed on the gate insulating layer 13. The polysilicon layer p-Si includes a source Q2$s$ and a drain Q2$d$, and the gate insulating layer 13 is formed of, for example, SiO$_2$. An interlayer dielectric ("ILD") layer 14 is formed on the driving TFT Q2. The ILD layer 14 includes a first insulating layer (or a lower insulating layer) 14$a$ and a second insulating layer (or an upper insulating layer) 14$b$ that are formed of, for example, SiO2 or SiNx. Via holes 14$s$ and 14$d$ are formed in the ILD layer 14 such that they expose the source Q2$s$ and the drain Q2$d$ of the polysilicon layer p-Si of the driving TFT Q2, respectively. A metallic source electrode Q2$se$ and a metallic drain electrode Q2$de$ are formed on the ILD layer 14 such that they fill the via holes 14$s$ and 14$d$, respectively.

The storage capacitor $C_{st}$ includes the lower electrode $C_{st-a}$, the upper electrode $C_{st-b}$, and the ILD layer 14 formed between the lower and upper electrodes $C_{st-a}$ and $C_{st-b}$. The lower electrode $C_{st-a}$ of the storage capacitor $C_{st}$ and the gate Q2$g$ of the driving TFT Q2 are simultaneously formed of the same material. According to an exemplary embodiment of the present invention, the ILD layer 14 between the lower and upper electrodes $C_{st-a}$ and $C_{st-b}$ is thinner than the ILD layer 14 on the driving TFT Q2. That is, the ILD layer 14 on the driving TFT Q2 has a sufficient thickness for electrical insulation. In addition, the ILD layer 14 in the storage capacitor $C_{st}$ is thinner than on the driving TFT Q2 such that storage capacitance of the storage capacitor $C_{st}$ increases. In this way, the thickness of the ILD layer 14 in the storage capacitor $C_{st}$ is reduced to increase the capacitance of the storage capacitor $C_{st}$. Accordingly, the present invention makes it possible to reduce the occupation area of the storage capacitor $C_{st}$ and thus to expand an electroluminescent ("EL") region in the pixel. Also, the ILD layer 14 in the regions of the switching TFT Q1 and the driving TFT Q2 is formed as thick as necessary to provide sufficient electrical insulation. To this end, the ILD layer 14 is formed to have two or more layers (i.e., the first and second insulating layers 14$a$ and 14$b$) on the switching TFT Q1 and the driving TFT Q2, and a contact hole 14$b$' is formed in the upper insulating layer 14$b$ in the storage capacitor $C_{st}$ region, thereby reducing a gap between the lower and upper electrodes $C_{st-a}$ and $C_{st-b}$. In order to form the ILD layer 14 with the above structure, the lower and upper insulating layers 14$a$ and 14$b$ are formed of different materials such that they have an etch selectivity with respect to specific etching conditions, as will be further described below with respect to an exemplary method of manufacturing the OELD 1.

An insulating layer 16 is formed on the storage capacitor $C_{st}$ and the driving TFT Q2, and a via hole 16' corresponding to the drain electrode Q2$de$ of the driving TFT Q2 is formed in the insulating layer 16. An anode is formed on the insulating layer 16 such that it fills the via hole 16'. The anode is formed of a transparent conductive material such as, but not limited to, indium tin oxide ("ITO"). A bank is formed on the insulating layer 16 at one side of the anode. The bank is formed of an insulating material. An OLED is formed on the anode and the bank. The OLED includes a hole transport layer, a luminescent layer, and an electron transport layer. A metallic cathode is formed on the OLED, and a passivation layer 17 is formed on the metallic cathode. Although not described above, the switching TFT Q1 is formed simultaneously with the driving TFT Q2 such that it also includes a polysilicon layer, a gate insulating layer, a gate, an ILD layer, a source electrode, and a drain electrode that are formed of the same materials as the corresponding elements of the driving TFT Q2.

While a particular example has been described, the above and equivalent layout of the OELD 1 is merely exemplary and is not intended to limit the scope of the present invention.

Figure 4A:
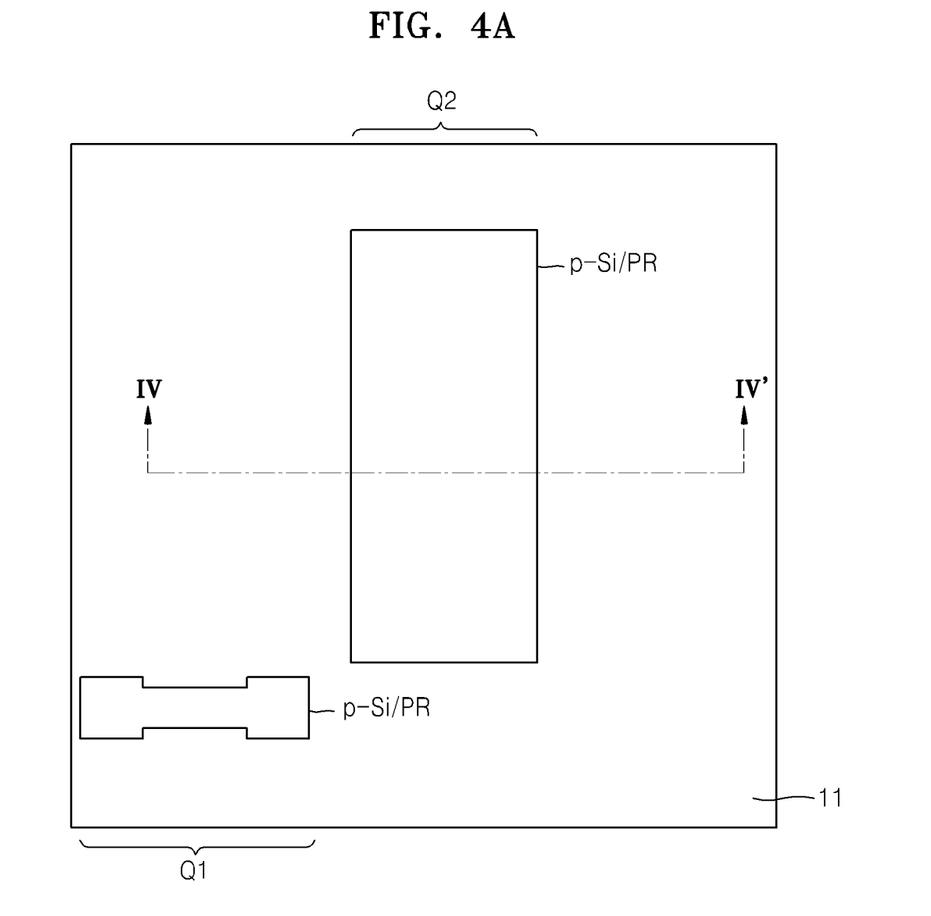
FIGS. 4A through 4R are layout and cross-sectional views illustrating an exemplary process of fabricating an exemplary semiconductor circuit of an exemplary OELD according to an exemplary embodiment of the present invention.
Figure 4B:
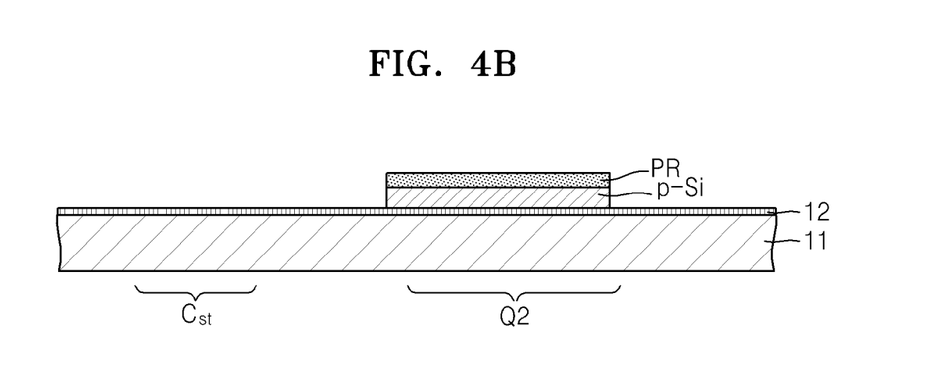
Figure 4C:
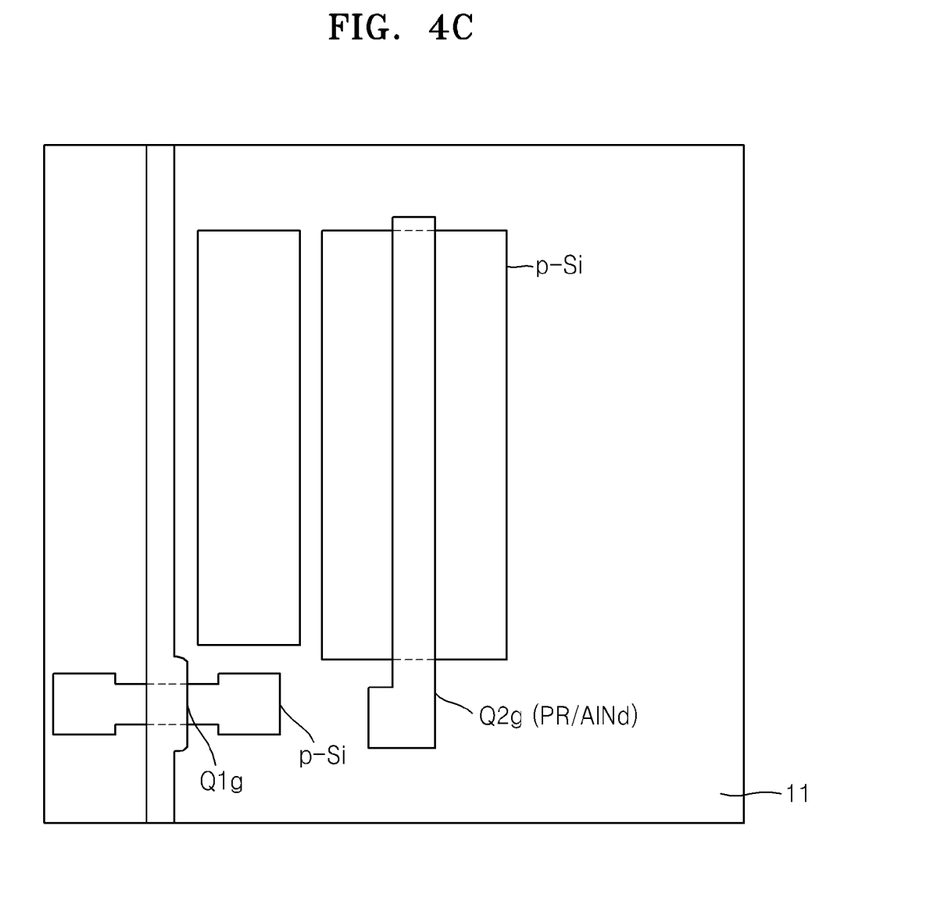
Figure 4D:
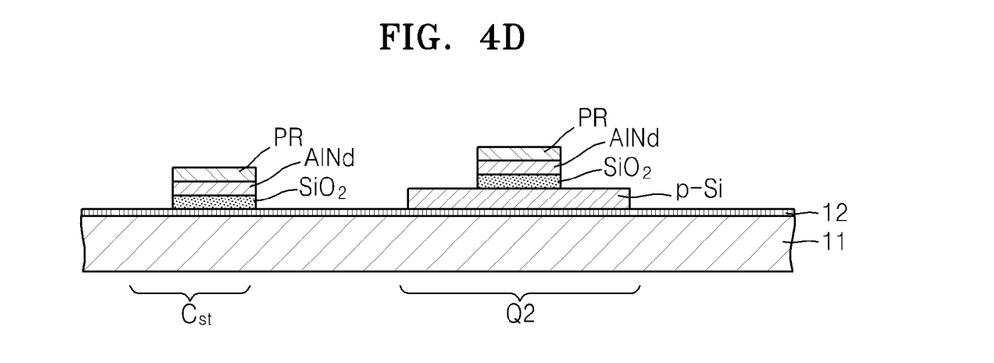
Figure 4E:
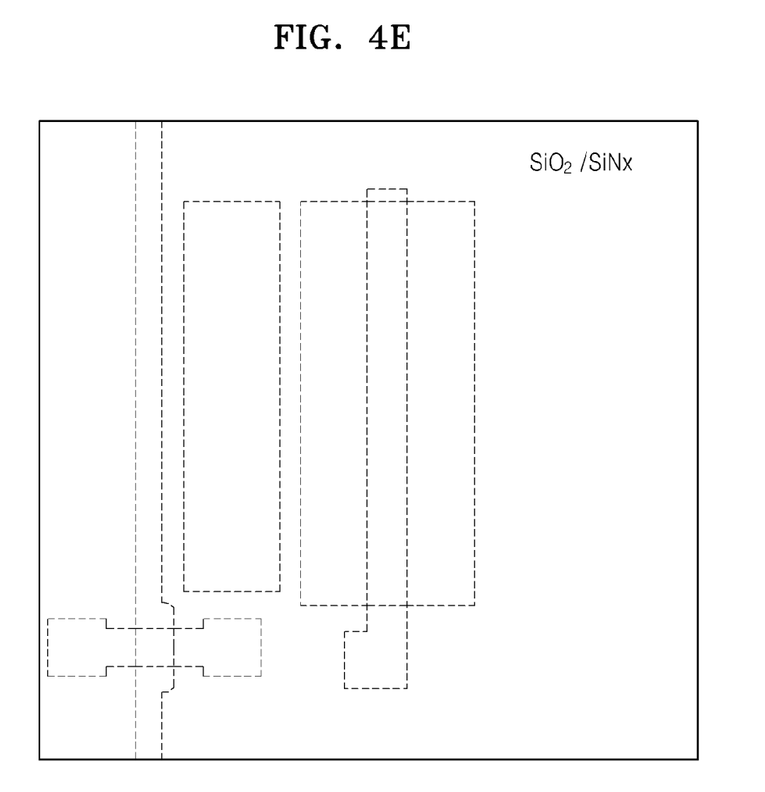
Figure 4F:
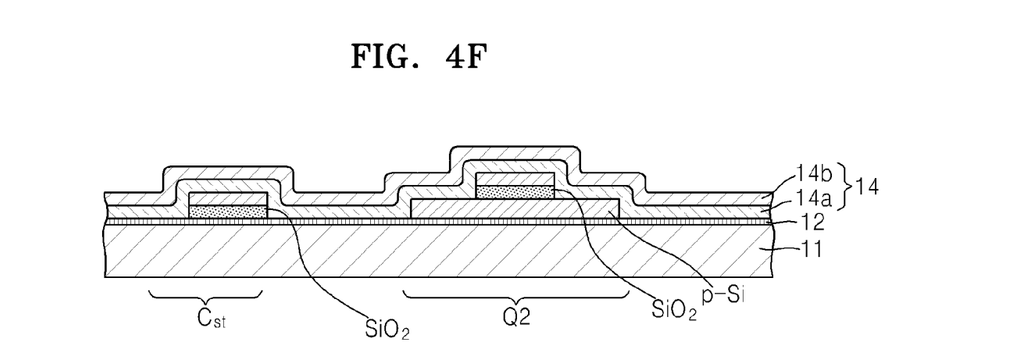
Figure 4G:
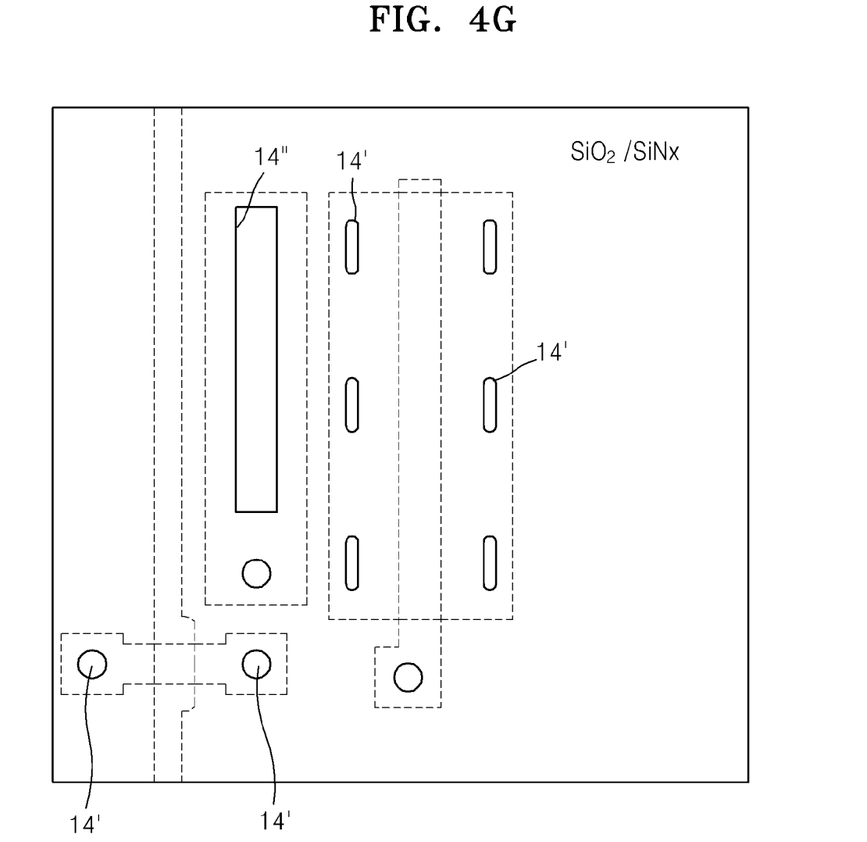
Figure 4H:
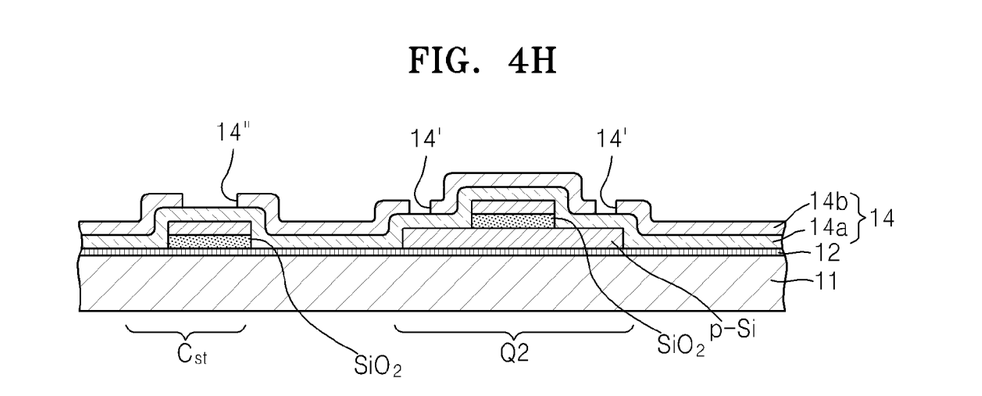
Figure 4I:
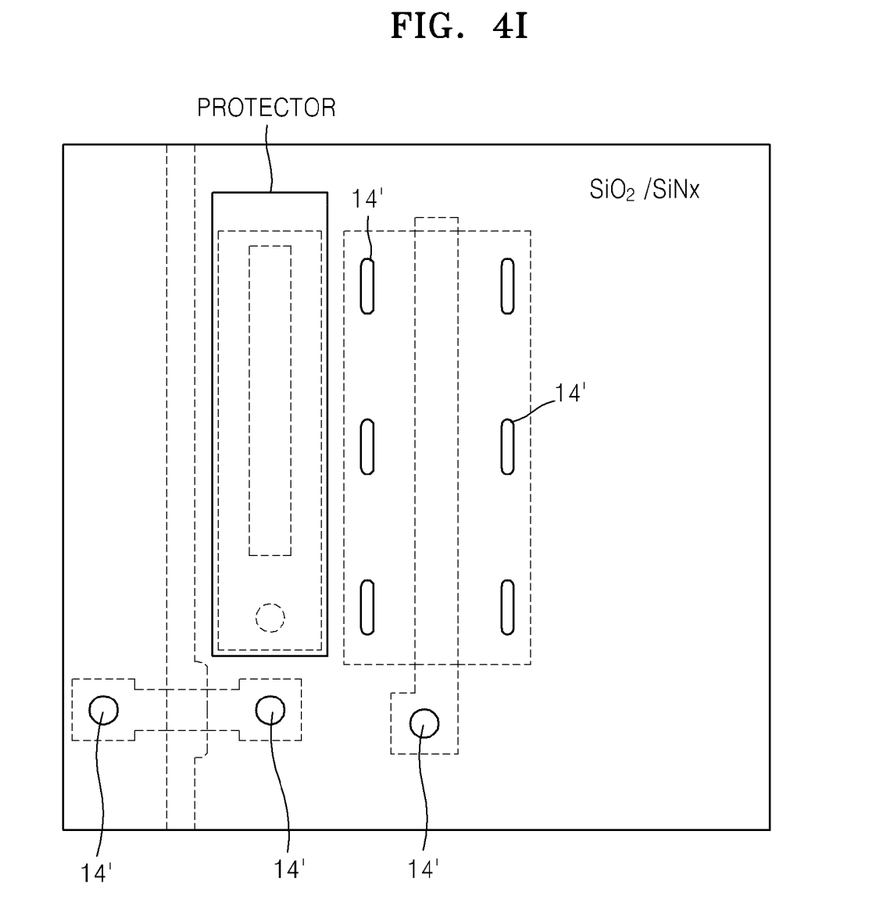
Figure 4J:
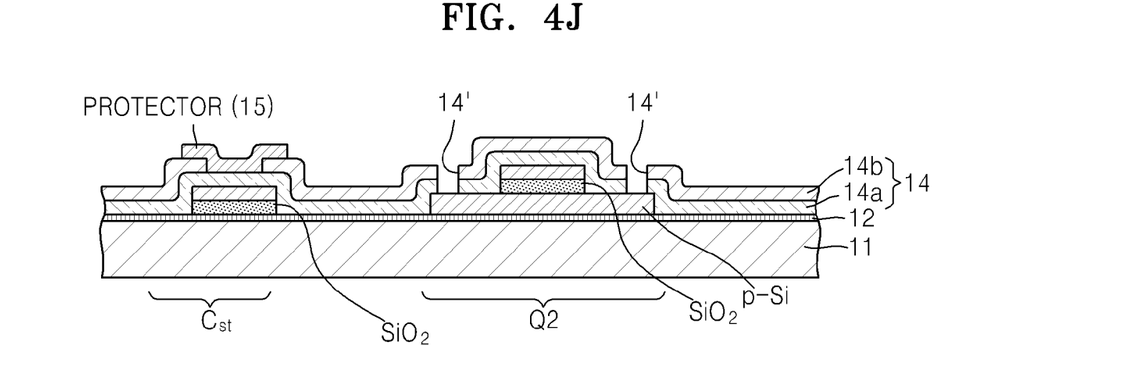
Figure 4K:
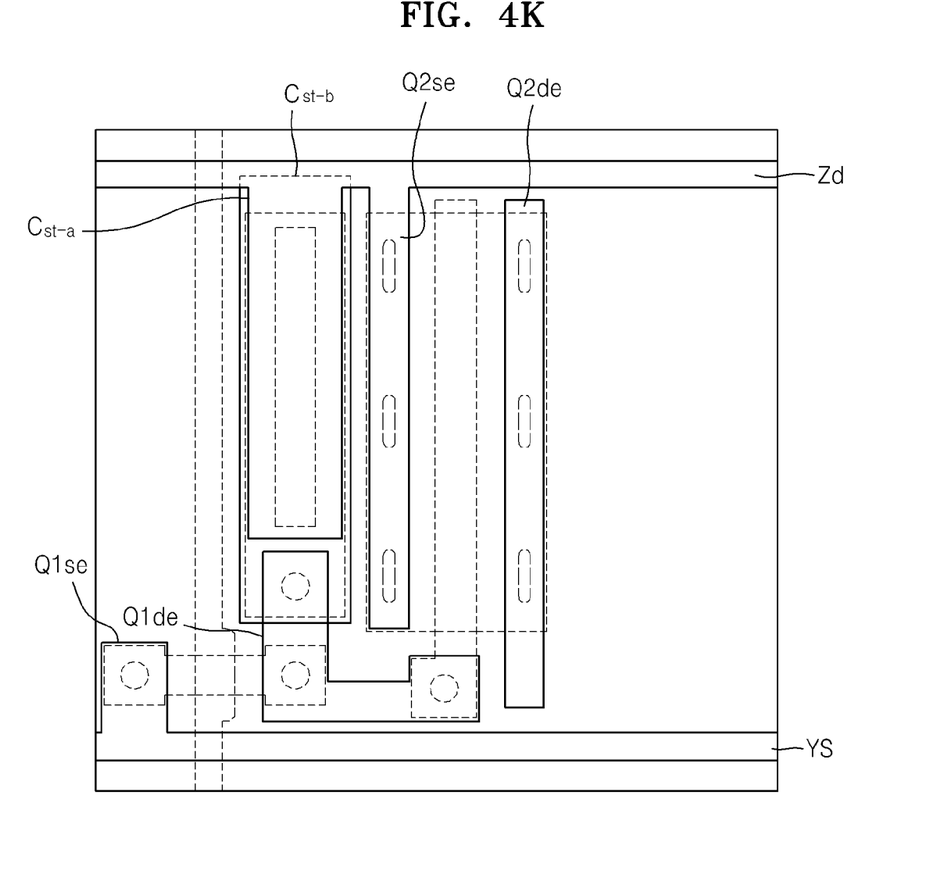
Figure 4L:
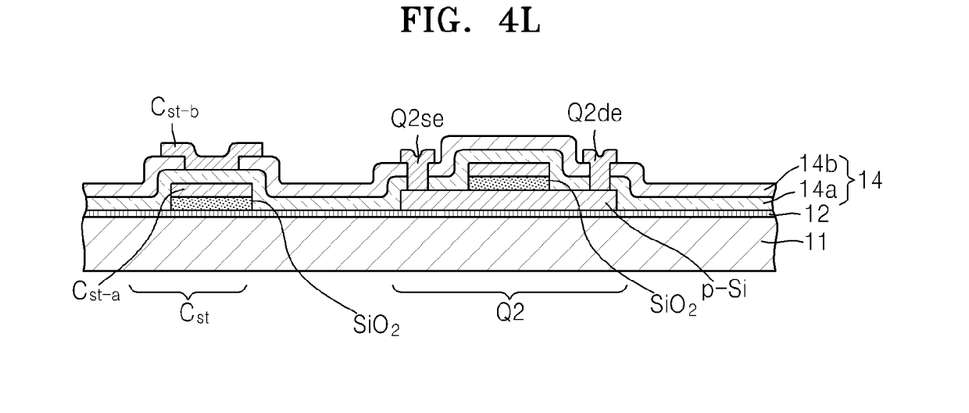
Figure 4M:
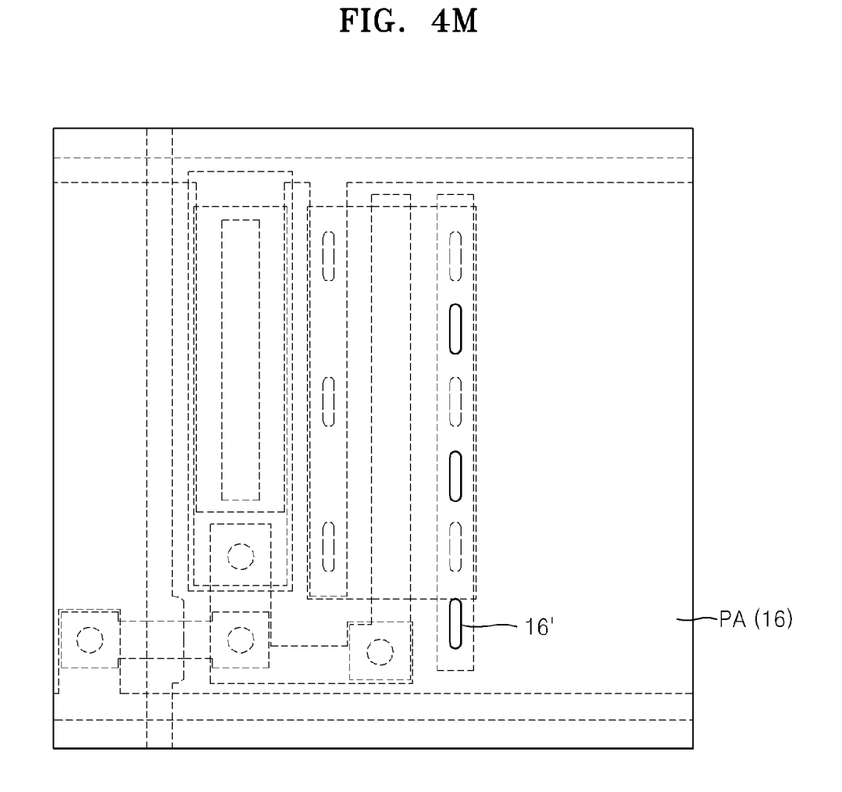
Figure 4N:
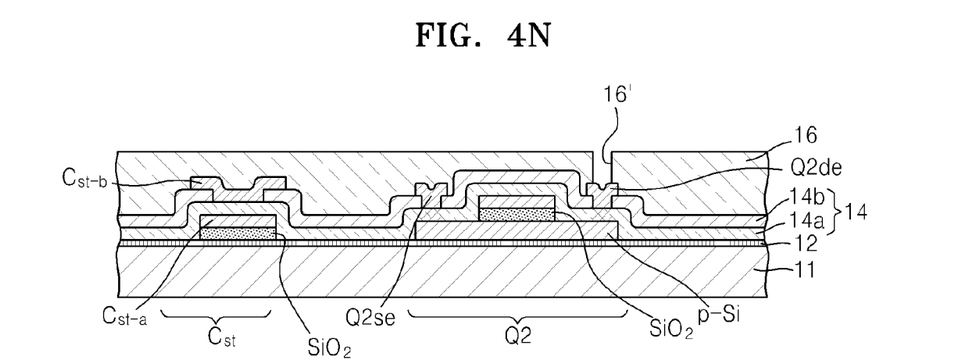
Figure 4O:
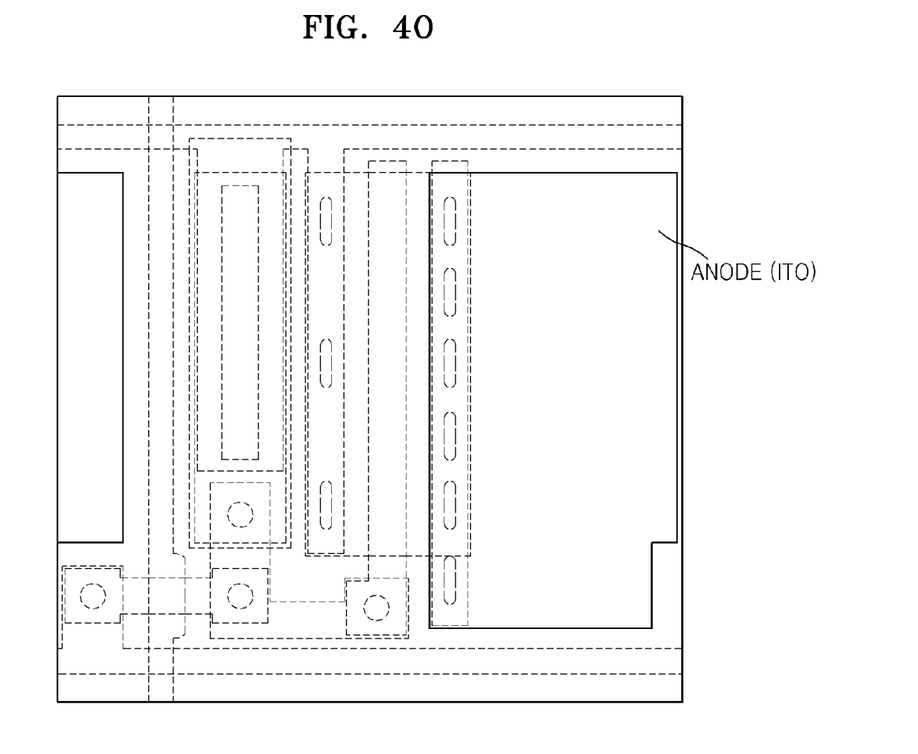
Figure 4P:
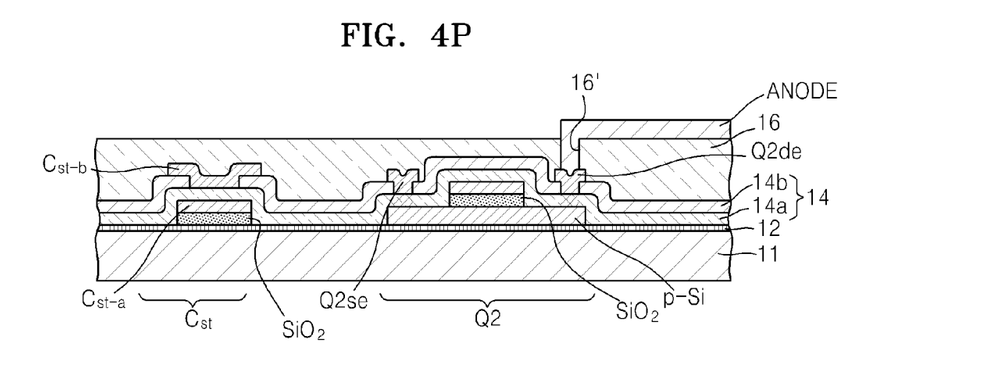
Figure 4Q:
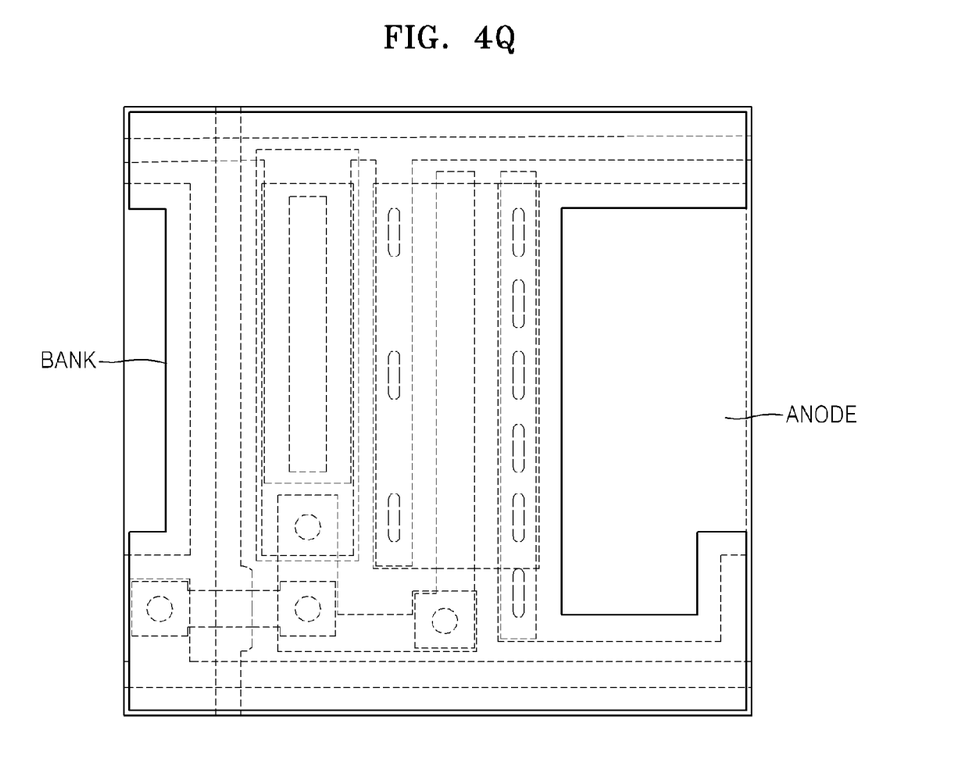
Figure 4R:
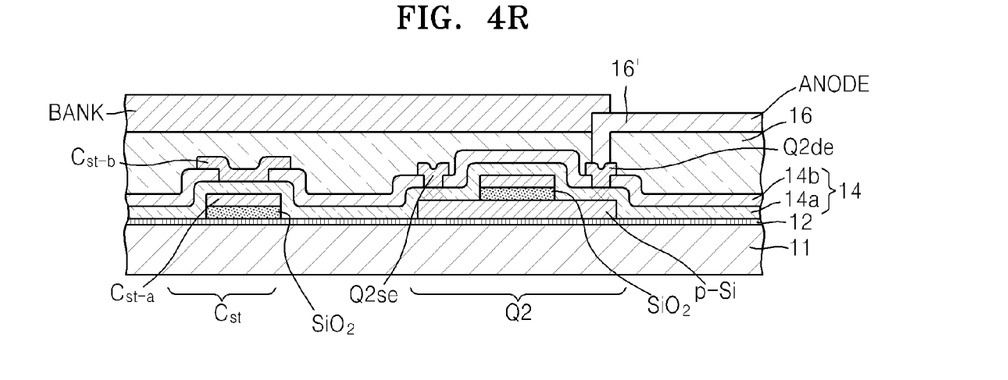

FIGS. 4A through 4R are views illustrating an exemplary method of fabricating an exemplary semiconductor circuit of an exemplary OELD according to an exemplary embodiment of the present invention. In each of FIGS. 4A through 4R, a first figure in a pair of figures is a layout diagram of an entire unit pixel, while a second figure in a pair of figures is a cross-sectional view taken along line IV-IV' of FIG. 4A to illustrate a storage capacitor $C_{st}$ and a driving TFT Q2.

As illustrated in FIGS. 4A and 4B, a polysilicon layer p-Si is formed on a glass or plastic substrate 11 using a well-known method. The substrate 11 may include a buffer layer 12, such that the buffer layer 12 is disposed between the substrate 11 and the polysilicon layer p-Si. Thereafter, a photoresist mask PR is used to form a silicon island for a source and an active layer of the driving TFT Q2. A polysilicon layer p-Si is also formed for the switching TFT Q1. The polysilicon layer p-Si is formed by crystallizing amorphous silicon ("a-

Si"). The photoresist mask PR and other photoresist masks, which will be described later, are removed before the corresponding next processes.

As illustrated in FIGS. 4C and 4D, a gate insulating layer of $SiO_2$ and a gate material layer of, for example, AlNd alloy are sequentially deposited on the substrate 11 including the silicon islands of p-Si. Thereafter, a photoresist mask PR is used to pattern the gate insulating layer and the gate material layer, thereby forming a gate insulating layer 13, a gate Q1g of a switching TFT Q1, a gate Q2g of the driving TFT Q2, and a lower electrode Cst-a of the storage capacitor Cst. At this point, the gate Q1g of the switching TFT Q1 is formed simultaneously with a scan line Xs as a portion of the scan line Xs. After the above gate patterning process, an exposed region of the silicon island of p-Si, which is not covered with the gates Q1g and Q2g, is doped, and the doped regions are activated by heat treatment.

As illustrated in FIGS. 4E and 4F, a first insulating layer 14a and a second insulating layer 14b are sequentially formed on the entire upper surface of the substrate 11, thereby forming an ILD layer 14. The first and second insulating layers 14a and 14b are formed of different materials that have an etch selectivity with respect to predetermined etching conditions.

For example, the first and second insulating layers 14a and 14b can be formed of different materials selected from a group including $SiO_2$, $SiN_x$, photoacryl ("PA"), and benzocyclobutene ("BCB"). While two insulating layers 14a and 14b are described, the ILD layer 14 may alternatively include more than two different insulating layers.

As illustrated in FIGS. 4G and 4H, contact holes (or via holes) 14' and a window 14" are formed in the second insulating layer 14b for electrical connection between the source and drain of the silicon island of p-Si of the switching TFT Q1 and the driving TFT Q2, and the storage capacitor $C_{st}$. The window 14" corresponds to the contact hole 14b' previously described with respect to FIG. 3. The contact holes 14' and the window 14" may be formed by dry etching. When the ILD layer 14 includes three or more insulating layers, the window 14" may be formed to pass through two or more of the insulating layers from the top. However, the first insulating layer 14a directly contacting the lower electrode Cst-a of the storage capacitor Cst and directly contacting the source and drain of the silicon island of p-Si is not etched in this process. Etching of the first insulating layer 14a is described below.

As illustrated in FIGS. 4I and 4J, after a protective layer, protector 15, is formed to cover the window 14" of the storage capacitor Cst region, the first insulating layer 14a under the via holes 14' is etched to partially expose the surfaces of the source and drain of the silicon island of p-Si, so that the via holes 14' correspond to via holes 14s and 14d previously described with respect to FIG. 3.

As illustrated in FIGS. 4K and 4L, after the protective layer 15 is removed, a metal layer, such as an AlNd layer, is formed on the resulting structure and then patterned to form an upper electrode $C_{st-b}$ of the storage capacitor $C_{st}$, source and drain electrodes Q1 se and Q1 de of the switching TFT Q1, and source and drain electrodes Q2se and Q2de of the driving TFT Q2 that fill the corresponding holes 14' and window 14".

As illustrated in FIGS. 4M and 4N, an insulating layer 16, such as made of PA, is formed on the resulting structure, and a via hole 16' exposing the drain electrode Q2de of the driving TFT Q2 is formed in the insulating layer 16.

As illustrated in FIGS. 4O and 4P, an anode material is deposited on the insulating layer 16 and then patterned to form an anode filling the via hole 16'. The anode is formed of a transparent conductive material such as, but not limited to, ITO.

As illustrated in FIGS. 4Q and 4R, a bank is formed on a portion of the insulating layer 16 that is not covered with the anode. The bank is formed of an insulating material such as PA. Thereafter, general processes are performed to complete the OELD 1 as illustrated in FIGS. 1 through 3.

The above OELD fabrication method is merely exemplary and is not intended to limit the scope of the present invention. For example, general materials for an OELD can be used to fabricate the OELD according to an exemplary embodiment of the present invention, but the present invention is not limited thereto.

The present invention can be conveniently applied to an OELD that uses a plastic substrate.

According to the present invention, the ILD layer includes two or more insulating layers and some of the insulating layers are removed from the storage capacitor region. Accordingly, the present invention can reduce the occupation area of the storage capacitor while maintaining the necessary capacitance of the storage capacitor. Also, in regions other than the storage capacitor region, the ILD layer can have a sufficient thickness for electrical insulation between layers that are disposed on and beneath the ILD layer.

Also, the present invention can reduce the occupation area of the storage capacitor while increasing the occupation area of the OLED. Accordingly, when compared to the prior art, the present invention can increase the occupation area of the OLED in each pixel, thereby enhancing the image brightness of the OELD.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating an organic electroluminescent display comprising an organic light-emitting diode, two or more thin film transistors, and a storage capacitor that are disposed in each of a plurality of pixels, the method comprising:

forming an active layer of a switching thin film transistor and an active layer of a driving thin film transistor on a substrate;

forming an insulating layer on the substrate and on the active layer of the switching thin film transistor and the active layer of the driving thin film transistor;

forming a metal layer on the insulating layer and patterning the metal layer to form a lower electrode of the storage capacitor, a gate corresponding to the active layer of the switching thin film transistor, and a gate corresponding to the active layer of the driving thin film transistor;

doping both end portions of each of the active layer of the switching thin film transistor and the active layer of the driving thin film transistor, which are not overlapped by the gates, to form a source and a drain in both of the end portions;

forming an interlayer dielectric layer on the gate of the switching thin film transistor, the gate of the driving thin film transistor, and the lower electrode of the storage capacitor, the interlayer dielectric layer comprising two or more insulating layers;

etching at least an uppermost insulating layer of the interlayer dielectric layer, but not a lowermost insulating layer, to form contact holes in at least the uppermost insulating layer on the source and drain of the thin film transistors, and a contact hole on the lower electrode;

forming a protective layer on the lowermost insulating layer over the storage capacitor and in the contact hole on the lower electrode and then forming contact holes in portions of the lowermost insulating layer exposing the source and drain of the thin film transistors; and forming a metal layer on the gate and the interlayer dielectric layer and patterning the metal layer to form electrodes, which are connected to the source and the drain of the active layer of the switching thin film transistor and the source and drain of the active layer of the driving thin film transistor, and an upper electrode corresponding to the lower electrode of the storage capacitor.

2. The method of claim 1, wherein the substrate is formed of glass or plastic.

3. The method of claim 2, wherein the interlayer dielectric layer comprises a first insulating layer and a second insulating layer.

4. The method of claim 3, wherein the first insulating layer and the second insulating layer are formed of different materials from each other, the different materials selected from a group including $SiO_2$, $SiN_x$, photoacryl, and benzocyclobutene.

5. The method of claim 1, wherein at least two of the insulating layers are formed of different materials from each other.

6. The method of claim 5, wherein the interlayer dielectric layer comprises a first insulating layer and a second insulating layer.

7. The method of claim 6, wherein the first insulating layer and the second insulating layer are formed of different materials from each other, the different materials selected from a group including $SiO_2$, $SiN_x$, photoacryl, and benzocyclobutene.

8. The method of claim 1, wherein the interlayer dielectric layer comprises a first insulating layer and a second insulating layer.

9. The method of claim 8, wherein the first insulating layer and the second insulating layer are formed of different materials from each other, the different materials selected from a group including $SiO_2$, $SiN_x$, photoacryl, and benzocyclobutene.

10. The method of claim 1, wherein at least two of the insulating layers are formed of different materials from each other, the different materials selected from a group including $SiO_2$, $SiN_x$, photoacryl, and benzocyclobutene.

* * * * *